(12) United States Patent
Harris et al.

(10) Patent No.: US 7,355,223 B2
(45) Date of Patent: Apr. 8, 2008

(54) VERTICAL JUNCTION FIELD EFFECT TRANSISTOR HAVING AN EPITAXIAL GATE

(75) Inventors: Christopher Harris, Taby (SE);
Andrei Konstantinov, Sollentuna (SE);
Cem Basceri, Reston, VA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/071,437

(22) Filed: Mar. 4, 2005

(65) Prior Publication Data

US 2006/0220072 A1    Oct. 5, 2006

(51) Int. Cl.
*H01L 29/80* (2006.01)
*H01L 31/112* (2006.01)

(52) U.S. Cl. .............. 257/256; 257/135; 438/137; 438/138

(58) Field of Classification Search ........ 257/330, 257/256, 331–332, 134–135, 133, 260, 263, 257/272, E29.055, E29.313; 438/133, 137–138, 438/173, 186
See application file for complete search history.

(56) References Cited

U.S. PATENT DOCUMENTS

| | | | |
|---|---|---|---|
| 4,003,036 A | 1/1977 | Jenne | |
| 6,690,040 B2 | 2/2004 | Chaudhry et al. | |
| 6,693,314 B2 | 2/2004 | Mitlehner et al. | |
| 6,794,251 B2 | 9/2004 | Blanchard | |
| 6,841,812 B2 | 1/2005 | Zhao | |
| 6,855,981 B2 | 2/2005 | Kumar et al. | |
| 2003/0042538 A1* | 3/2003 | Kumar et al. | 257/328 |
| 2005/0056893 A1* | 3/2005 | Hadizad | 257/348 |
| 2005/0067630 A1 | 3/2005 | Zhao | |

OTHER PUBLICATIONS

J.H. Zhao, K. Tone, X. Li, P. Alexandrov, L. Fursin, and M. Weiner; 6A, 1kV 4H-SiC Normally-off Trenched-and-Implanted Vertical JFETs.

Phelps, G.J., Dopant Ion Implantation Simulations in 4H-Silicon Carbide, Institute of Physics Publishing; Modeling Simul. Mater. Sci.Eng 12 (2004) 1139-1146.

* cited by examiner

*Primary Examiner*—Scott B. Geyer
*Assistant Examiner*—Thanh Y. Tran
(74) *Attorney, Agent, or Firm*—Volentine & Whitt, P.L.L.C.

(57) ABSTRACT

A vertical junction field effect transistor includes a trench formed in an epitaxial layer. The trench surrounds a channel region of the epitaxial layer. The channel region may have a graded or uniform dopant concentration profile. An epitaxial gate structure is formed within the trench by epitaxial regrowth. The epitaxial gate structure may include separate first and second epitaxial gate layers, and may have either a graded or uniform dopant concentration profile.

25 Claims, 6 Drawing Sheets

VERTICAL JUNCTION FIELD EFFECT TRANSISTOR HAVING AN EPITAXIAL GATE

BACKGROUND OF THE INVENTION

1. Field of the Invention

The present invention relates to a vertical junction field effect transistor having epitaxial gate layers in a trench surrounding a vertical channel region, and methods of making such devices.

2. Background

MOSFET based power switches generally have low reliability due to gate oxide failure, and also possess high forward voltage drop. Vertical junction field effect transistors (VJFETs) typically provide more efficient power control without the problems associated with MOSFETs. However, VJFETs have high on-state resistance. Short-channel VJFETs are known to provide lower on-state resistance, but typically require high turn-off voltage. There is thus a need to provide an improved VJFET that can be more easily turned off and that has lower on-state resistance.

SUMMARY

In accordance with an exemplary embodiment, a vertical junction field effect transistor includes a vertical channel region of a first conductivity type over a drain region; a trench surrounding the vertical channel region; an epitaxial gate of a second conductivity type opposite the first conductivity type, formed on sidewalls and a bottom of the trench; and a source region over an upper surface of the vertical channel region.

BRIEF DESCRIPTION OF THE DRAWINGS

The above and other objects and features of the present invention will become apparent from the following description of the preferred embodiments made in conjunction with accompanied drawings, in which.

DETAILED DESCRIPTION

Figure 1:
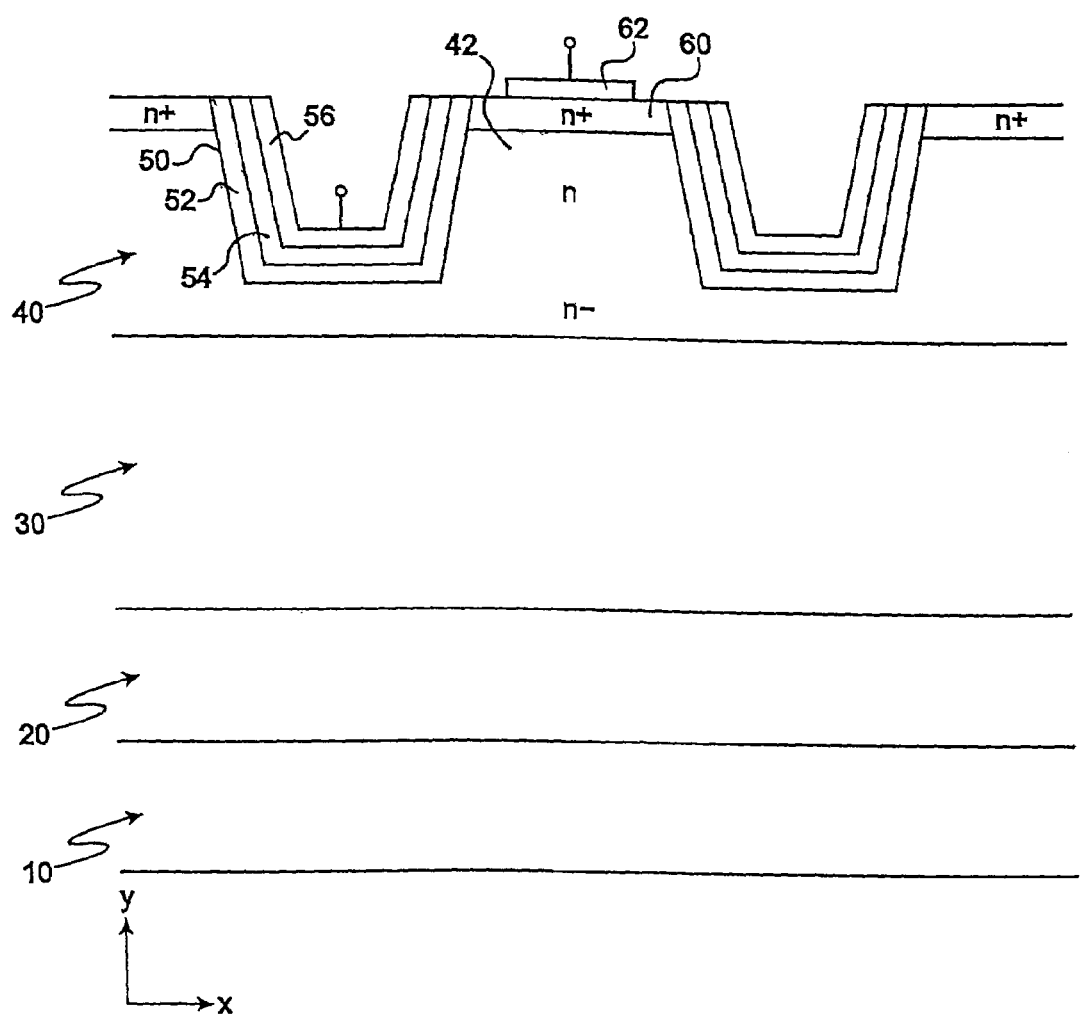
FIG. 1 illustrates a cross section of a vertical junction field effect transistor of a first embodiment.

The present invention will now be described more fully with reference to the accompanying drawings, in which preferred embodiments of the invention are shown. This invention may, however, be embodied in many different forms and should not be construed as limited to the embodiments set forth herein. Rather, the embodiments as described are provided so that this disclosure will be thorough and complete and will fully convey the concept of the invention to those skilled in the art. In the drawings, the shapes of elements are exaggerated for clarity, and are not necessarily drawn to scale, and like reference numerals are used to refer to like elements throughout the application.

FIG. 1 illustrates an n-channel vertical junction field effect transistor (VJFET) of a first embodiment of the invention. Although an n-channel VJFET is described in this embodiment, the following description contemplates embodiments including a p-channel VJFET, wherein the conductivity types as described with respect to FIG. 1 are reversed. Furthermore, it is emphasized that the dopants, materials and fabrication techniques described are merely intended to be illustrative and not limiting.

In FIG. 1, an $n^+$-type silicon carbide (SiC) drain epitaxial layer 20 is shown as formed on substrate 10. An n-type silicon carbide blocking drift epitaxial layer 30 is shown as formed on $n^+$-type drain epitaxial layer 20. An n-type silicon carbide epitaxial layer 40 is formed on n-type blocking drift epitaxial layer 30. An uppermost surface of epitaxial layer 40 has $n^+$-type silicon carbide source epitaxial layer 60 formed thereon. In this embodiment, source epitaxial layer 60 is part of the original epitaxial. That is, drain epitaxial 20, blocking drift epitaxial layer 30, epitaxial layer 40 and source epitaxial layer 60 are sequentially grown during the same process, in a manner as conventionally known. For example, the layers may be epitaxially grown using metal organic chemical vapor deposition (MOCVD), and nitrogen or phosphorus may be used as n-type dopants.

The n-type epitaxial layer 40 has a graded dopant profile, so that a bottom portion thereof near the upper surface of n-type blocking drift epitaxial layer 30 has lightly doped n-type concentration ($n^-$), and a top portion thereof above the bottom portion has more heavily doped n-type concentration. Notably, this doping profile is not essential and in an alternative embodiment, n-type epitaxial layer 40 may have a constant dopant profile.

A trench 50 is formed in epitaxial layer 40 and source epitaxial layer 60 by conventional etching and photolithography, using $SiO_2$ or a metal as an appropriate mask for silicon carbide. Although FIG. 1 shows a cross-sectional view of the structure, it should be understood that trench 50 is formed as a substantially continuous loop or trench. The remaining portion of epitaxial layer 40 between the illustrated sections of trench 50 serves as channel region 42, which is substantially surrounded on all sides thereof by trench 50. For example, trench 50 may have a cross-sectional width of about 2 μm and depth of about 2 μm. The cross-sectional width of channel region 42 between portions of trench 50 may be about 1 μm.

Epitaxial gate layers 52 and 54 are subsequently formed on the upper surface of the structure and including within trench 50, by epitaxial regrowth of silicon carbide, as follows. Since silicon carbide is a comparatively hard, dense material, ion implantation of the trench surface to form a gate layer therein requires high energy implantation, which will damage the lattice structure of silicon carbide epitaxial layer 40. Accordingly, to avoid such crystal lattice damage, an epitaxial regrowth process is used to conformally grow p-type silicon carbide gate layers on the upper planar surface of the structure and on the surfaces of epitaxial layer 40 and source epitaxial layer 60 within trench 50. The epitaxial regrowth process involves regrowth on both horizontal and vertical surfaces, which requires careful control of growth parameters such as the ratio of carbon to silicon precursors, for example. Aluminum or boron may be used as p-type dopants.

Since the crystal planes of silicon carbide epitaxial layer 40 along the bottom surface and the sidewalls of trench 50 are not the same, epitaxial regrowth of silicon carbide within the trench is non-uniform. That is, epitaxial regrowth in the horizontal direction (the x direction as shown in FIG. 1) is significantly greater than epitaxial regrowth in the vertical direction (the y direction as shown in FIG. 1). For example, the rate of epitaxial regrowth of silicon carbide in the horizontal direction can be about three times greater than the rate of epitaxial regrowth of silicon carbide in the vertical direction. In contrast, dopant incorporation of impurities is much greater during epitaxial regrowth of silicon carbide in the vertical direction than during epitaxial regrowth of silicon carbide in the horizontal direction. For example, the rate of dopant incorporation during epitaxial regrowth of silicon carbide in the vertical direction can be about ten times greater than the rate of dopant incorporation during epitaxial regrowth of silicon carbide in the horizontal direction.

During the non-uniform epitaxial regrowth of silicon carbide, first silicon carbide epitaxial gate layer 52 is initially formed conformally on the entire upper surface of the structure. As a result of the anisotropy in growth rate, this could for example result in a layer having a thickness $t_{p1}=0.1$ μm on the bottom surface of trench 50, and a thickness $3t_{p1}=0.3$ μm on the sidewalls of trench 50. Also, as a result of the above described non-uniform dopant incorporation, the concentration of p-type dopants ($P_1$) within first epitaxial gate layer 52 on the sidewall surfaces of trench 50 could be approximately $1\times10^{18}$ cm$^{-3}$, and the concentration of p-type dopants ($P_1$) within first epitaxial gate layer 52 on the bottom surface of trench 50 could be approximately ten times as great as $P_1$ or approximately $10^{19}$ cm$^{-3}$. It should be understood however that the above noted thicknesses and dopant concentrations are exemplary, and merely illustrate the non-uniformity of epitaxial regrowth and dopant concentration. Notably, gate thickness and dopant concentration may be selected to accommodate a particular design, and should not be construed as limited to the above noted values.

In addition to a first epitaxial gate layer 52, further epitaxial gate layer(s) may be grown making use of growth anisotropy. For example, subsequent formation of first epitaxial gate layer 52, second silicon carbide epitaxial gate layer 54 may be initially formed conformally on the entire upper surface of the structure previously covered by first epitaxial gate layer 52, and thus within trench 50. The thickness and dopant incorporation of second epitaxial gate layer 54 on the bottom and sidewalls within trench 50 are non-uniform. Second epitaxial gate layer 54 can be formed as having a thickness ($t_{p2}$) on the order of approximately 0.1 μm over the bottom of trench 50, and a thickness of approximately $3t_{p2}$, or approximately 0.3 μm, over the sidewalls of trench 50, for example. Also, the concentration of p-type dopants ($P_2$) within second epitaxial gate layer 54 over the sidewalls of trench 50 can be approximately $1\times10^{19}$ cm$^{-3}$, and the concentration of p-type dopants within second epitaxial gate layer 54 over the bottom surface of trench 50 can be approximately ten times as great as $P_2$, or approximately $1\times10^{20}$ cm$^{-3}$, for example. As emphasized above with respect to first epitaxial gate layer 52, gate thickness and dopant concentration of second epitaxial gate layer 54 are given by way of example and illustrate the non-uniformity of epitaxial regrowth, and should not be construed as limiting. It should also be noted that the dopant concentration in second epitaxial gate layer 54 can be made to be greater than the dopant concentration of first epitaxial gate layer 50. Also as noted above, the use of second epitaxial gate layer 54 is optional. The device would be functional using a single epitaxial gate layer such as first epitaxial gate layer 52.

Subsequent formation of initial first and second epitaxial gate layers 52 and 54, the surface of the structure may be planarized using well-known chemical mechanical polishing or the like, so that excess portions of first and second epitaxial gate layers 52 and 54 grown on the structure outside of trench 50 are removed, and so that n$^+$-type source layer 60 is exposed, as illustrated in FIG. 1. This may include filling trench 50 with an oxide or the like, and polishing the structure until a planar surface is obtained and source layer 60 is exposed. Thereafter, gate contact 56 and source contact 62 are respectively formed on second epitaxial gate layer 54 and source layer 60. Gate and ohmic contact metals may be chosen according to the application of the VJFET, but in general should be chosen to provide minimum contact resistance. For example, Ni, TiW, Cr or CoSi$_2$ may be used as contact metals. Also, all contacts are subject to a high temperature anneal greater than 900° C., to complete the n-channel VJFET structure.

As described previously, the dopant profile of n-type impurities in channel region 42 is graded in a vertical direction. This enables the channel to be designed so that depletion of the channel upon application of a positive potential to gate contact 56 can be substantially limited to the vicinity of the bottom of the channel, thus helping to avoid short channel effects. Since the VJFET as designed with a graded channel region has an n$^-$-type region of lower dopant concentration of the bottom portion of channel region 42, this portion of the channel has relatively fewer charge carriers (electrons in this case). Consequently, this corresponding portion of the channel is easier to quickly pinch-off at a relatively lower voltage. The normally on VJFET therefore may be turned off more easily at lower voltages, and the normally-off VJFET can thus be controlled with lower on-state resistance.

Since dopant concentration of the channel region 42 between the trench 50 increases toward source layer 60 and since dopant concentration of the blocking drift epitaxial layer 30 approaching toward drain epitaxial layer 20 are greater than the aforementioned region of lower dopant concentration, overall resistance of the channel between the gate and drain is decreased. This improves the on-state resistance of the device. Also, the double layered epitaxial gate provides a smooth, graded pn junction that is less abrupt. As a result, the junction is more easily able to support the applied voltage. By this overall design, channel region 42 can be made narrow, leading to more compact devices, improved integration and improved device performance. Also, the use of epitaxial regrown silicon carbide advantageously enables grading of the junction in both the horizontal and vertical directions.

A second embodiment is shown and described in connection with FIG. 2. In this example embodiment, the epitaxial structure of the VJFET includes substrate 10, drain epitaxial layer 20, blocking drift epitaxial layer 30, graded epitaxial layer 40, trench 50, epitaxial source layer 60 and source contact 62 similarly as described with respect to FIG. 1. Epitaxial gate layer 70 is formed in trench 50 by epitaxial regrowth of silicon carbide, and is shown as a single layer. The p-type dopant incorporated into epitaxial gate layer 70 during epitaxial regrowth is graded in a horizontal direction, so that a lower p-type dopant concentration is realized near the channel region 42 and a higher p$^+$-type dopant concentration is realized toward the center of trench 50. This variation of doping concentrations, which may be realized by adjustment of growth precursors for example, provides a smooth, graded pn junction that is less abrupt, and thus more easily able to support the applied voltage.

Figure 2:
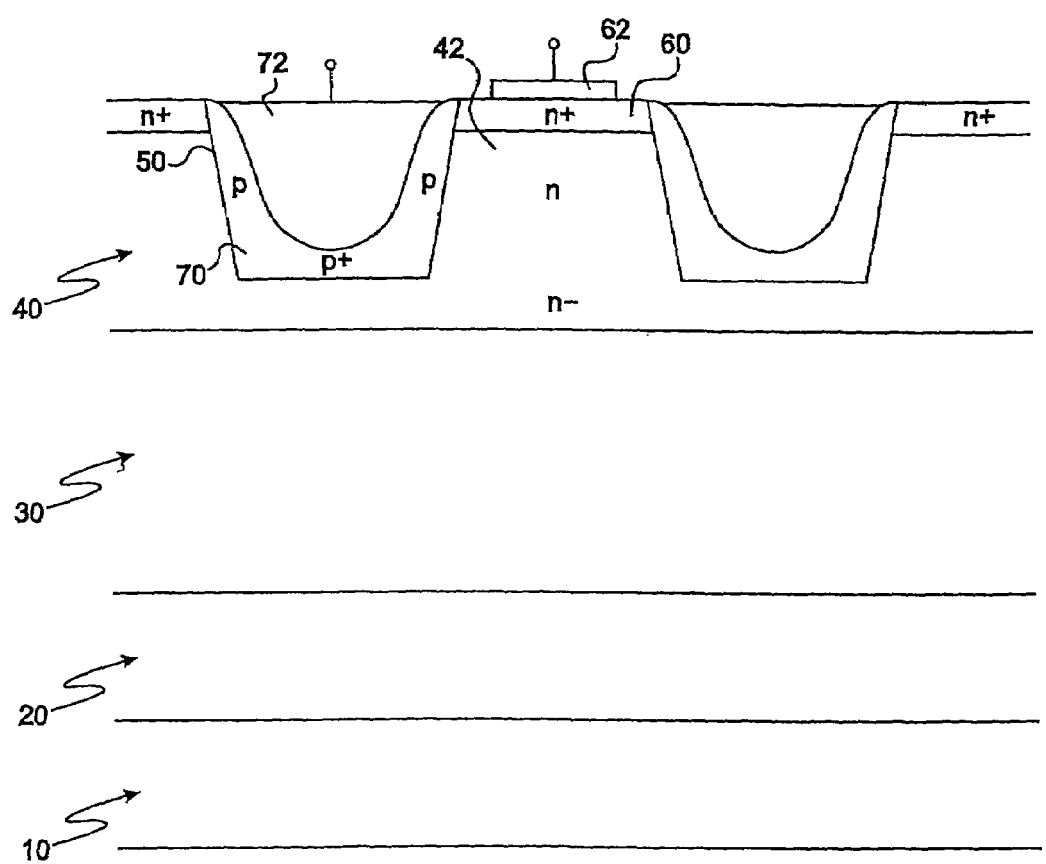
FIG. 2 illustrates a cross section of a vertical junction field effect transistor of a second embodiment.

In the embodiment of FIG. 2, gate contact 72 is formed whereby the entire trench is filled with metallization. A metallization is initially formed on the entire surface of the structure after formation of trench 50, by conventional techniques such as plasma sputtering or evaporation and CVD. The metallization is then planarized using conventional techniques such as chemical mechanical polishing (CMP), so that the metallization exists only in trench 50 on epitaxial gate layer 70 as gate contact 72. This gate contact 72 is formed as a deeper metallization that is more robust than a shallow gate contact, and also helps avoid shorting of the gate to source. As an alternative, an oxide passivation layer (not shown) may be formed within trench 50 prior to filling trench 50 with metallization. This oxide passivation layer would effectively increase the distance between gate contact 72 and source contact 62, helping to prevent gate to source leakage. As a further alternative, a hole may be first etched through epitaxial gate layer 70 through to the bottom of trench 50, so that the subsequently formed gate contact 72 is in contact with epitaxial layer 40. Incidentally, the gate contact in the VJFET of FIG. 1 may also be formed using deep metallization as noted above, to provide a more robust gate contact.

Figure 3:
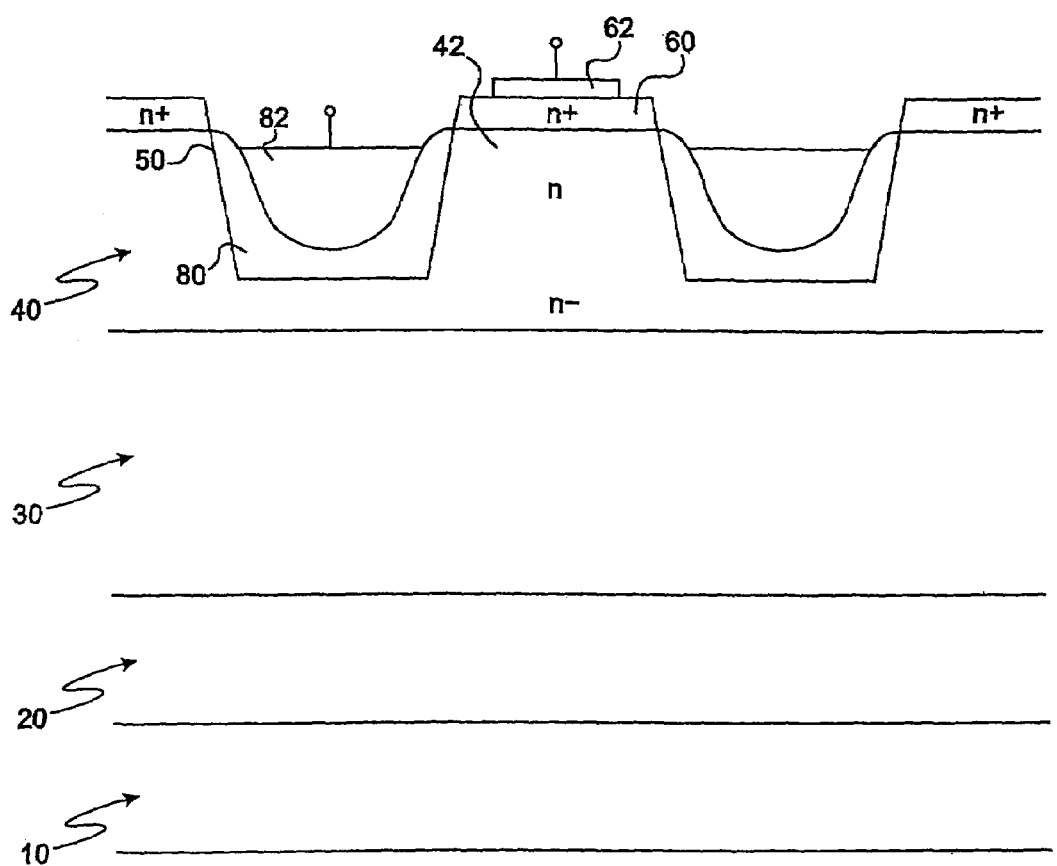
FIG. 3 illustrates a cross section of a vertical junction field effect transistor of a third embodiment.

A third embodiment is shown in and described in connection with FIG. 3. In this example embodiment, the epitaxial structure of the VJFET includes substrate 10, drain epitaxial layer 20, blocking drift epitaxial layer 30, graded epitaxial layer 40, trench 50, epitaxial source layer 60 and source contact 62, similarly as described with respect to FIG. 1. Epitaxial gate layer 80 is shown as a single layer and is formed in trench 50 by epitaxial regrowth of silicon carbide. Epitaxial gate layer 80 may have a p-type dopant profile that is graded in the horizontal direction, as described with respect to FIG. 2. In the alternative, epitaxial gate layer 80 may include respective first and second epitaxial gate layers in a manner similar as described with respect to FIG. 1. However, prior to metallization to form gate contact 82, conformal epitaxial gate layer 80 is overetched during planarization, so that epitaxial gate layer 80 does not overlap with epitaxial source layer 60 of channel region 42. That is, epitaxial gate layer 80 is overetched so that the uppermost portion thereof on the sidewalls of trench 50 are below the level of epitaxial source layer 60 and are not in contact with epitaxial source layer 60, to thus minimize gate to source leakage. Epitaxial gate layer overlap with the source region may thus be advantageously avoided, while maintaining a somewhat deep, robust gate contact metallization.

A fourth embodiment is shown in and described in connection with FIG. 4. In this example embodiment, the epitaxial structure of the VJFET includes substrate 10, drain epitaxial layer 20, blocking drift epitaxial layer 30, graded epitaxial layer 40, trench 50, epitaxial source layer 60 and source contact 62 similarly as described with respect to FIG. 1. Epitaxial gate layer 90 is shown as a single layer, and is formed in trench 50 using epitaxial regrowth of silicon carbide. Epitaxial gate layer 90 may have a p-type dopant profile graded in the horizontal direction as described in FIG. 2. Alternatively, epitaxial gate layer 90 may include respective first and second epitaxial gate layers, in a manner similar as described with respect to FIG. 1. However, epitaxial gate layer 90 is overetched, and thus is formed so as to primarily overlap the sidewall of trench 50 only near the n$^-$-type region of lower dopant concentration within channel region 42. Gate contact 92 is then formed on epitaxial gate layer 90 within trench 50.

Figure 4:
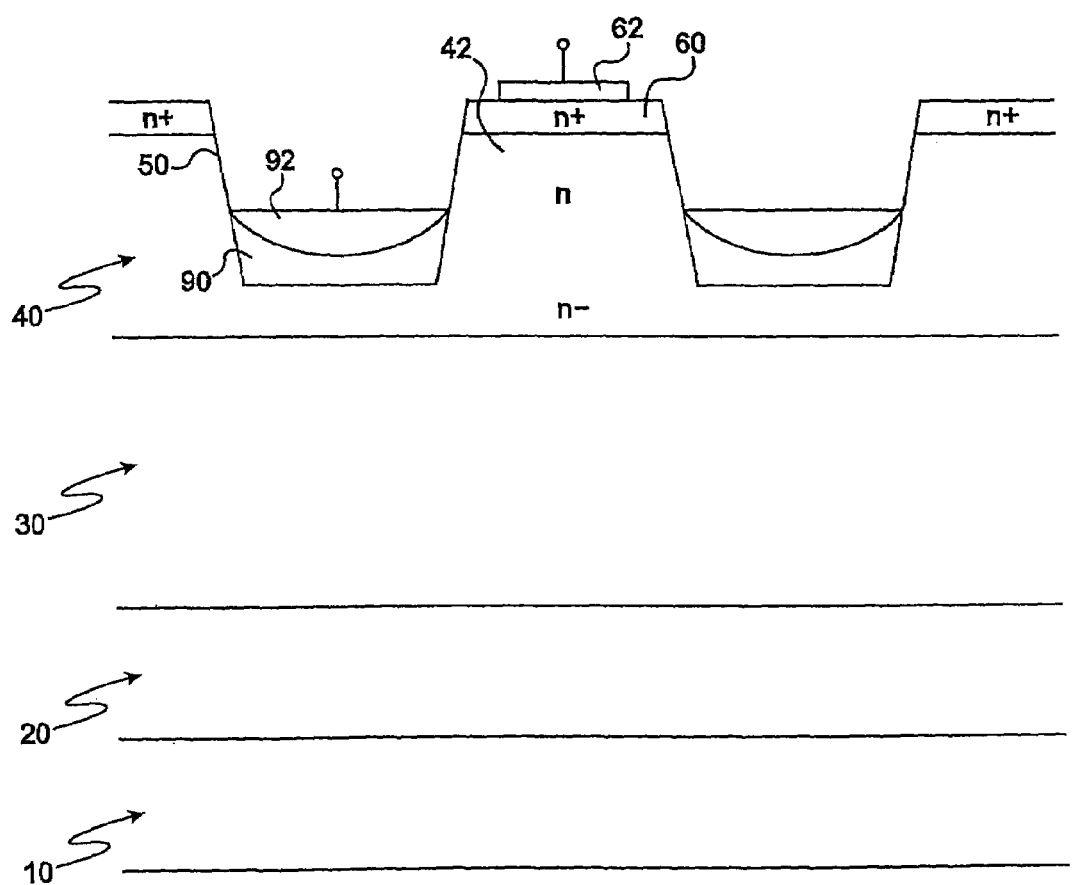
FIG. 4 illustrates a cross section of a vertical junction field effect transistor of a fourth embodiment.

In FIG. 4, formation of epitaxial gate layer 90 as described diminishes channel height. As a result, source region 60 is farther away from the point in which the channel is pinched off. Since epitaxial gate layer 90 is relatively shorter, less of an area needs to be pinched off. The n-type channel region above the n$^-$-type region of lower dopant concentration is not pinched off, and correspondingly does not contribute to on-state resistance of the device as significantly. Also, epitaxial gate layer 90 and gate contact 92 are farther away from source contact 62, thus reducing the risk of gate to source shorting.

A fifth embodiment is shown in and described in connection with FIG. 5. In this example embodiment, the epitaxial structure of the VJFET is similar to the previously described devices, including substrate 10, drain epitaxial layer 20, blocking drift epitaxial layer 30, graded epitaxial layer 40, trench 50, epitaxial source layer 60 and source contact 62. However, subsequent formation of trench 50 and prior to formation of an epitaxial gate layer, p-type dopants are implanted into the bottom of trench 50, to form p-implant region 104 in n-type epitaxial layer 40. Crystal damage resulting from this implant would be localized, and mostly recovered during regrowth.

Implant region 104 is shown as having a p-type dopant profile that is graded in a horizontal direction, so that shallow regions of p$^-$-type lower dopant concentration are formed at the bottom of trench 50 in epitaxial layer 40 near the sidewalls of trench 50, and so that a deeper region of higher p$^+$-type dopant concentration is formed at the bottom of trench 50 in eptiaxial layer 40 near the middle or central portion of trench 50. A single epitaxial gate layer 100 is subsequently conformally formed in trench 50 by epitaxial regrowth of silicon carbide. Deep metallization gate contact 102 is formed on epitaxial gate layer 100 within trench 50. The VJFET of FIG. 5 thus has a p-type gate structure that is partially implanted, and that has a smooth p$^+$ to p$^-$ to n junction along the bottom of trench 50 near the pinch-off region within channel region 42, that is more easily able to support the applied voltage. This structure can advantageously be made without the need to epitaxially regrow a highly doped second epitaxial gate layer. As an alternative, a hole may be first etched through epitaxial gate layer 100 to implant region 104, so that gate contact 102 subsequently formed thereon may be in contact with implant region 104. As a result, epitaxial gate layer 100 may be doped lighter, to provide a softer graded pn junction.

Figure 5:
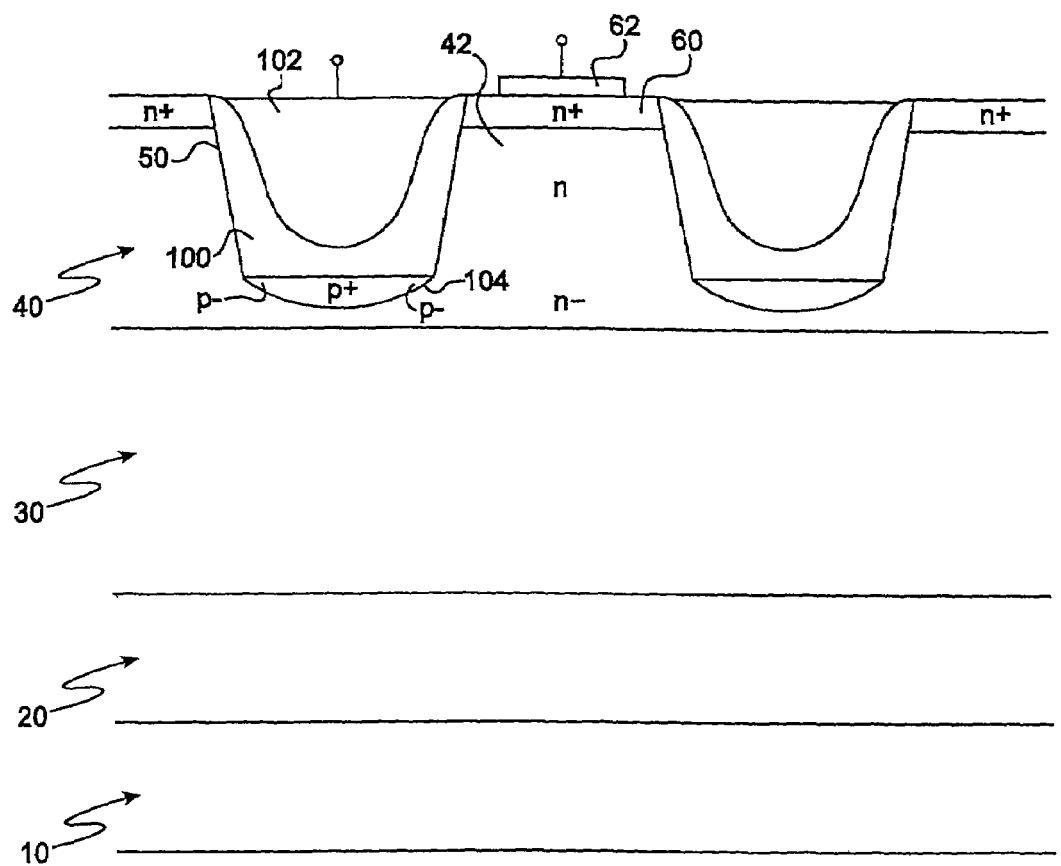
FIG. 5 illustrates a cross section of a vertical junction field effect transistor of a fifth embodiment.
Figure 6:
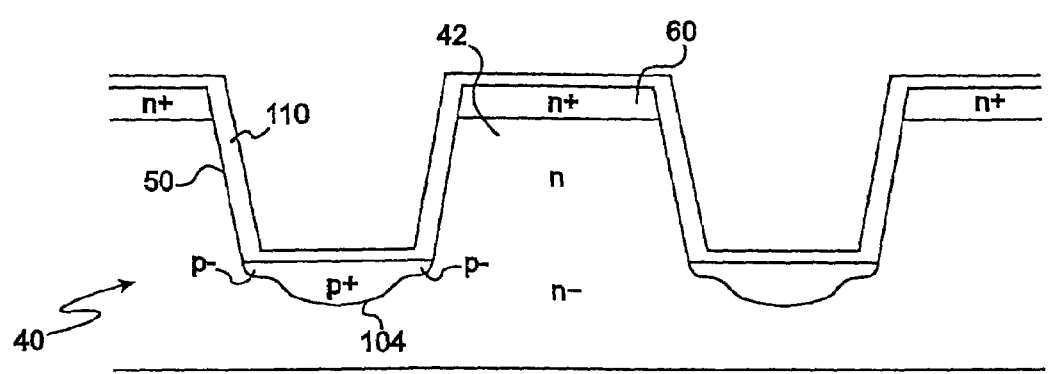
FIG. 6 illustrates a cross section of a structure descriptive of the method of making the vertical junction field effect transistor of the fifth embodiment.

The manner in which p-implant region 104 in FIG. 5 is formed is described with reference to FIG. 6 as follows. FIG. 6 illustrates a portion of the structure as described in FIG. 5, including for the sake of brevity only n-type epitaxial layer 40, epitaxial source layer 60 and trench 50 prior to formation of an epitaxial gate layer and gate and source contacts. As described previously with respect to FIG. 1, since the crystal planes of epitaxial layer 40 along the bottom surface and the sidewalls of trench 50 are not the same, the rate of epitaxial regrowth of silicon carbide within trench 50 is not uniform. Similarly, the oxidation growth rate of thermally grown oxide on epitaxial layer 40 within trench 50 is non-uniform because of the different crystal planes of epitaxial layer 40 within trench 50. The rate of thermal oxidation of epitaxial layer 40 in the horizontal direction on the sidewalls of trench 50 is significantly greater than the rate of thermal oxidation of epitaxial layer 40 in the vertical direction on the bottom surface of trench 50. The rate of thermal oxidation may typically be approximately more than two times greater in the horizontal direction than in the vertical direction.

Accordingly, subsequent preparation of the epitaxial structure including substrate 10, drain epitaxial layer 20, blocking drift epitaxial layer 30, graded epitaxial layer 40, epitaxial source layer 60 and trench 50, and prior to formation of an epitaxial gate layer and gate and source contacts, the structure is placed in an oxidation furnace so as to thermally oxidize the n-type silicon carbide epitaxial layer 40. Oxidation layer 110 as shown in FIG. 6 is thus conformally grown on surfaces of the structure, as including somewhat thicker portions along sidewalls of trench 50 and somewhat thinner portions along the bottom of trench 50 and the upper horizontal surface of the structure. For example, the thickness of oxidation layer 110 on the sidewalls and the bottom of trench can respectively be about 0.1 µm and 0.05 µm.

In the alternative, the oxidation layer 110 may be deposited oxide grown by PECVD, HTO/LTO or TEOS for example, instead of being thermally grown. This would provide a deposited oxide layer of uniform thickness that could have thickness of about 0.5 µm on the entirety of the structure. The deposited oxide layer would then be anisotropically etched to provide an oxidation layer 110 on the sidewalls and bottom of trench 50 having respective thicknesses of about 0.5 µm and 0.1 µm, for example.

The structure having oxidation layer 110 formed thereon as described in either manner as noted above, is subsequently masked using standard photolithography processing. Openings are provided in the mask (not shown) so that channel region 42 is covered by the mask, and so that trench 50 and the upper horizontal edge portion of oxidation layer 110 on sidewalls of trench 50 are exposed. Implantation of a p-type dopant is then carried out at high temperature. The p implant region 104 is thus formed self-aligned, and has a graded dopant profile in the horizontal direction due to the effective difference in vertical thickness of oxidation layer 110 conformally formed within trench 50. That is, since the portions of epitaxial layer 40 near the sidewalls of trench 50 have oxidation layer 110 formed thereon that is of much greater vertical thickness than the portions of oxidation layer 110 formed on epitaxial layer 40 near the middle or central portion of trench 50, the dopant concentration and implant depth of implant region 104 are significantly greater at the middle of trench 50 than near the sidewalls of trench 50. Oxidation layer 110 may then be subsequently removed, followed by formation of epitaxial gate layer 100 and gate and source contact 102 and 62, to complete manufacture of the VJFET shown in FIG. 5.

Although the present invention has been described in detail, the scope of the invention should not be limited by the corresponding description and figures. For example, although silicon carbide epitaxial layers and epitaxial regrowth layers are described, other semiconductor compounds such as GaN, BN or ZnO or the like in which epitaxial regrowth is different in horizontal and vertical directions may be used. This advantageously enables grading of the junction in both the horizontal and vertical directions. Also, the concepts of this invention may be applicable to heterojunction type structures. For example, due to the different alignments and bound offsets of the dissimilar materials, depletion of the channel may be increased. This is particularly appropriate for the nitride group of materials including GaN/AlGaN, GaN/SiC, AlGaN/SiC, AlN/SiC and AlBN/SiC, for example. These various changes and modifications of the preferred embodiments, as would become apparent to those of ordinary skill, should be considered as within the spirit and scope of the invention.

What is claimed is:

1. A vertical junction field effect transistor comprising:
    a vertical channel region of a first conductivity type over a drain region;
    a trench surrounding the vertical channel region;
    an epitaxial gate of a second conductivity type opposite the first conductivity type, formed on sidewalls and a bottom of the trench; and
    a source region over an upper surface of the vertical channel region,
    wherein the vertical channel region has a dopant profile that is graded in a vertical direction.

2. The vertical junction field effect transistor of claim 1, wherein the epitaxial gate comprises first and second epitaxial gate layers sequentially formed on the sidewalls and the bottom of the trench.

3. The vertical junction field effect transistor of claim 2, wherein portions of the first and second epitaxial gate layers on the sidewalls of the trench have a first thickness, and portions of the first and second epitaxial gate layers on the bottom of the trench have a second thickness, and wherein the first thickness is greater than the second thickness.

4. The vertical junction field effect transistor of claim 2, wherein a dopant concentration of the second epitaxial gate layer is greater than a dopant concentration of the first epitaxial gate layer.

5. The vertical junction field effect transistor of claim 1, wherein a dopant concentration in the vertical channel region is lowest at a junction area near the epitaxial gate.

6. The vertical junction field effect transistor of claim 5, wherein the dopant concentration in the vertical channel region is greatest near the source and drain regions.

7. The vertical junction field effect transistor of claim 1, wherein the epitaxial gate is formed on the sidewalls of the trench so as to be substantially non-overlapping with the source region.

8. The vertical junction field effect transistor of claim 1, wherein the vertical channel region is an epitaxial layer.

9. The vertical junction field effect transistor of claim 8, wherein the epitaxial layer and the epitaxial gate are SiC.

10. The vertical junction field effect transistor of claim 8, wherein the epitaxial layer and the epitaxial gate are GaN.

11. The vertical junction field effect transistor of claim 8, wherein the epitaxial layer and the epitaxial gate constitute a heterojunction.

12. The vertical junction field effect transistor of claim 1, wherein the second conductivity type is p type conductivity.

13. The vertical junction field effect transistor of claim 1, further comprising a passivation layer between the trench and the epitaxial gate.

14. A vertical junction field effect transistor comprising:
    a vertical channel region of a first conductivity type over a drain region;
    a trench surrounding the vertical channel region;
    an epitaxial pate of a second conductivity type opposite the first conductivity type, formed on sidewalls and a bottom of the trench; and
    a source region over an upper surface of the vertical channel region,
    wherein the epitaxial gate has a trench portion formed entirely therethrough, and gate contact metallization is within the trench portion in contact with the bottom of the trench.

15. The vertical junction field effect transistor of claim 1, wherein the epitaxial gate has a graded dopant profile in a horizontal direction.

16. The vertical junction field effect transistor of claim 1, wherein a dopant concentration of the epitaxial gate on the bottom of the trench is greater than a dopant concentration of the epitaxial gate on the sidewalls of the trench.

17. A vertical channel field effect transistor comprising:
   a drain layer of a first conductivity type formed on a substrate;
   a blocking drift layer of the first conductivity type formed on the drain layer;
   a first layer of the first conductivity type formed on the blocking drift layer, the first layer having a dopant profile that is graded in the vertical direction;
   a trench formed in the first layer, the trench surrounding and defining a channel region within the first layer;
   a first epitaxial gate layer of a second conductivity type opposite the first conductivity type conformally formed on sidewalls and a bottom of the trench;
   a second epitaxial gate layer of the second conductivity type conformally formed on the first epitaxial gate layer; and
   a source layer of the first conductivity type formed on the channel region.

18. The vertical junction field effect transistor of claim 17, wherein a dopant concentration in the channel region is lowest near the bottom of the trench.

19. The vertical junction field effect transistor of claim 17, wherein the first and second epitaxial gate layers are formed on the sidewalls of the trench so as to be substantially non-overlapping with the source layer.

20. The vertical junction field effect transistor of claim 17, wherein portions of the first and second epitaxial gate layers covering the sidewalls of the trench have a first thickness and portions of the first and second epitaxial gate layers covering the bottom of the trench have a second thickness, and wherein the first thickness is greater than the second thickness.

21. The vertical junction field effect transistor of claim 17, wherein dopant concentration of the first and second epitaxial gate layers covering the bottom of the trench are greater than dopant concentration of the first and second epitaxial gate layers covering the sidewalls of the trench.

22. The vertical junction field effect transistor of claim 17, wherein a dopant concentration of the second epitaxial gate layer is greater than a dopant concentration of the first epitaxial gate layer.

23. The vertical junction field effect transistor of claim 17, wherein the first and second epitaxial gate layers and the channel layer are SiC.

24. The vertical junction field effect transistor of claim 17, wherein the first and second epitaxial gate layers and the channel layer are GaN.

25. The vertical junction field effect transistor of claim 17, wherein the first and second epitaxial gate layers, and the channel layer, constitute a heterojunction.

* * * * *